United States Patent
Fukagawa et al.

(10) Patent No.: US 7,230,692 B2
(45) Date of Patent: Jun. 12, 2007

(54) OPTICAL APPARATUS, METHOD OF DETERMINING POSITION OF OPTICAL ELEMENT IN OPTICAL SYSTEM, AND DEVICE MANUFACTURING METHOD

(75) Inventors: Youzou Fukagawa, Tochigi-ken (JP); Toshiyuki Yoshihara, Tochigi-ken (JP); Mario Nakamori, Yokohama (JP); Yuji Shinano, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 104 days.

(21) Appl. No.: 11/080,407

(22) Filed: Mar. 16, 2005

(65) Prior Publication Data
US 2005/0206880 A1    Sep. 22, 2005

(30) Foreign Application Priority Data
Mar. 17, 2004   (JP)   ............................. 2004-077044

(51) Int. Cl.
G01B 9/00 (2006.01)
(52) U.S. Cl. ...................................... 356/124; 356/601
(58) Field of Classification Search ........ 356/124–127, 356/399–401, 601–613; 359/711, 668, 710, 359/649, 650, 651; 355/53
See application file for complete search history.

(56) References Cited

U.S. PATENT DOCUMENTS 6,741,328 B2     5/2004   Yonekawa et al. ............. 355/53
6,924,884 B2 *   8/2005   Boonman et al. .............. 355/55
2002/0163738 A1  11/2002  Yoshihara .................... 359/711
2005/0030638 A1   2/2005  Yoshihara .................... 359/668

FOREIGN PATENT DOCUMENTS

JP      11-176744      7/1999
JP      2002-367886   12/2002

OTHER PUBLICATIONS

T. Yoshihara, et al., "Realization of Very-Small Aberration Projection Lenses", Proceedings of SPIE, vol. 4000, pp. 559-566 (2000).

* cited by examiner

Primary Examiner—Gregory J. Toatley, Jr.
Assistant Examiner—Tri Ton
(74) Attorney, Agent, or Firm—Fitzpatrick, Cella, Harper & Scinto

(57) ABSTRACT

An optical apparatus including an image forming optical system having a movable optical element, and a driving mechanism. A first block obtains a linear evaluation value by normalizing, by a first tolerance, an aberration expressed by a linear function of a position of the movable optical element and normalizing, by a second tolerance, an aberration expressed by a quadratic function of the position out of the aberrations of the optical system. A second block obtains a minimum value of a dummy variable by linear programming. A third block determines a position of the optical element to be moved by the driving mechanism using a value prepared by adding a relaxation amount to the minimum value obtained by the second block and minimizes the weighted sum of the quadratic evaluation values by adjusting the weights assigned to the quadratic evaluation values and a relaxation amount.

12 Claims, 8 Drawing Sheets

OPTICAL APPARATUS, METHOD OF DETERMINING POSITION OF OPTICAL ELEMENT IN OPTICAL SYSTEM, AND DEVICE MANUFACTURING METHOD

FIELD OF THE INVENTION

The present invention relates to a technique for adjusting aberration of an optical system.

BACKGROUND OF THE INVENTION

As described in "T. Yoshihara et al., "Realization of very-small aberration projection lenses", Proc. SPIE 2000, Vol. 4000-52" and Japanese Patent Laid-Open No. 11-176744, the projection optical system of a semiconductor exposure apparatus is prepared through the first step of measuring optical characteristics, the second step of calculating an adjustment amount for properly correcting various aberrations of the projection optical system on the basis of the measured optical characteristics, and the third step of actually adjusting or processing the projection optical system in accordance with the adjustment amount.

Most of aberrations to be corrected change in proportion to the adjustment amount of each part. In order to minimize the maximum absolute value of each aberration, the adjustment amount of each part is determined by a method to which linear programming is applied (Japanese Patent Laid-Open No. 2002-367886).

However, a change in wavefront aberration which is one of important aberrations, which is one of important aberrations, cannot be expressed as the linear function of the adjustment amount of each part. The method disclosed in Japanese Patent Laid-Open No. 2002-367886 cannot calculate optimal adjustment amounts for various aberrations including the wavefront aberration.

SUMMARY OF THE INVENTION

The present invention has been made in consideration of the above drawbacks, and an exemplified object thereof is to provide a novel technique concerning aberration adjustment of an optical system.

According to the first aspect of the present invention, there is provided an optical apparatus including an image forming optical system having a movable optical element, and a driving mechanism which moves the optical element. The apparatus comprises a first block which obtains a linear evaluation value by normalizing, by a first tolerance, an aberration expressed by a linear function of a position of the movable optical element out of aberrations of the optical system, and a quadratic evaluation value by normalizing, by a second tolerance, an aberration expressed by a quadratic function of the position out of the aberrations of the optical system, a second block which obtains a minimum value of a dummy variable by linear programming using an upper limit value of the linear evaluation value as the dummy variable, and a third block which determines a position of the optical element to be moved by the driving mechanism so as to minimize a weighted sum of the quadratic evaluation values with respect to a plurality of image heights by using, as the upper limit value of the linear evaluation value, a value prepared by adding a relaxation amount to the minimum value of the dummy variable that is obtained by the second block. The third block minimizes the weighted sum of the quadratic evaluation values by adjusting the weights assigned to the quadratic evaluation values and the relaxation amount.

According to the second aspect of the present invention, there is provided an optical apparatus including an optical system having a movable optical element, and a driving mechanism, which moves the optical element. The apparatus comprises a first block, which obtains a linear evaluation value by normalizing, by a tolerance, an aberration expressed by a linear function of a position of the movable optical element out of aberrations of the optical system, a second block which defines, by a first dummy variable, an upper limit of an absolute value of a Zernike coefficient associated with wavefront aberration of the optical system, and obtains a linear evaluation value that approximates a root mean square of the wavefront aberration by a linear function of the first dummy variable, and a third block which defines, by a second dummy variable, an upper limit of the linear evaluation values obtained by the first block and the second block, and determines a position of the optical element to be moved by the driving mechanism, so as to minimize the second dummy variable by linear programming.

According to the third aspect of the present invention, there is provided a method of determining a position of an optical element in an optical apparatus which includes an image forming optical system having the optical element, and a driving mechanism which moves the optical element. The method comprises a first step of obtaining a linear evaluation value by normalizing, by a first tolerance, an aberration expressed by a linear function of a position of the optical element out of aberrations of the optical system, and a quadratic evaluation value by normalizing, by a second tolerance, an aberration expressed by a quadratic function of the position out of the aberrations of the optical system, a second step of obtaining a minimum value of a dummy variable by linear programming using an upper limit value of the linear evaluation values as the dummy variable, and a third step of determining a position of the optical element to be moved by the driving mechanism so as to minimize a weighted sum of the quadratic evaluation values with respect to a plurality of image heights by using, as the upper limit value of the linear evaluation value, a value prepared by adding a relaxation amount to the minimum value of the dummy variable that is obtained in the second step. In the third step, the weighted sum of the quadratic evaluation values is minimized by adjusting the weights assigned to the quadratic evaluation values and the relaxation amount.

According to the fourth aspect of the present invention, there is provided a method of determining a position of an optical element in an optical apparatus which includes an optical system having the optical element, and a driving mechanism which moves the optical element. The method comprises a first step of obtaining a linear evaluation value by normalizing, by a tolerance, an aberration expressed by a linear function of a position of the optical element out of aberrations of the optical system, a second step of defining, by a first dummy variable, an upper limit of an absolute value of a Zernike coefficient associated with wavefront aberration of the optical system, and obtaining a linear evaluation which approximates a root means square of the wavefront aberration by a linear function of the first dummy variable, and a third step of defining, by a second dummy variable, an upper limit of the linear evaluation values obtained in the first step and the second step, and determining a position of the optical element to be moved by the driving mechanism, so as to minimize the second dummy variable by linear programming.

According to the preferred embodiment of the present invention, the apparatus can be an exposure apparatus which transfers a pattern to a substrate using the optical system.

According to the fifth aspect of the present invention, there is provided a device manufacturing method comprising steps of transferring a pattern to a substrate using the above exposure apparatus, and developing the substrate to which the pattern has been transferred.

According to the sixth aspect of the present invention, there is provided a device manufacturing method comprising steps of moving an optical element in an optical system of an exposure apparatus to a position as determined in accordance with the above method, transferring a pattern to a substrate using the exposure apparatus of which the optical element is moved in the moving step, and developing the substrate to which the pattern has been transferred.

According to the present invention, a novel technique concerning aberration adjustment of an optical system is provided.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

DETAILED DESCRIPTION OF THE PREFERRED EMBODIMENTS

Preferred embodiments of the present invention will be described below with reference to the accompanying drawings.

Figure 1:
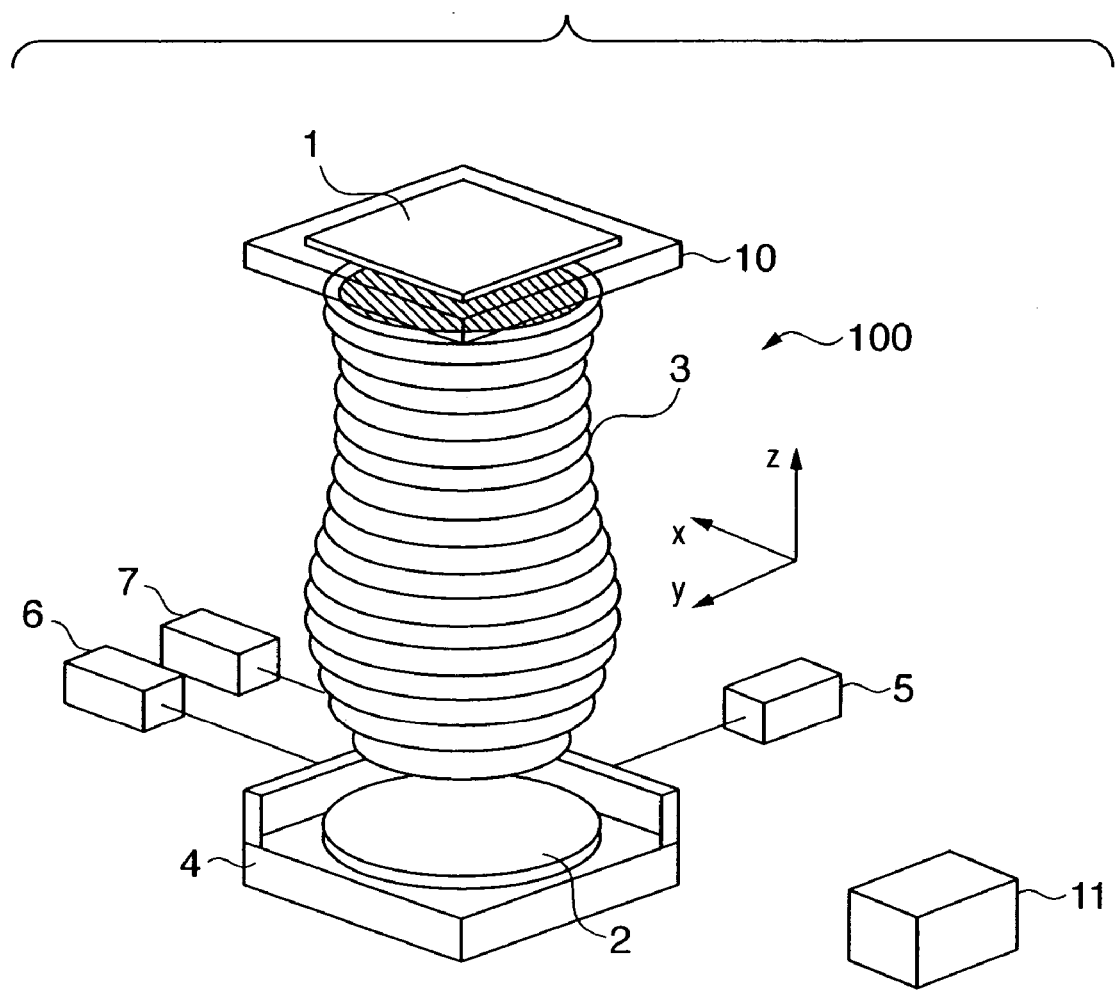
FIG. 1 is a view schematically showing an arrangement example of an exposure apparatus according to a preferred embodiment of the present invention.

FIG. 1 is a view schematically showing an arrangement example of an exposure apparatus according to the preferred embodiments of the present invention. An exposure apparatus 100 comprises a reticle stage 10 which holds a reticle 1, a wafer stage which holds a wafer 2, a projection optical system 3 which projects the pattern of the reticle 1 onto the wafer 2, laser interferometers 5, 6, and 7 which measure the position of a wafer stage 4, and a control unit 11 including an adjusting unit which adjusts the characteristics of the optical system including the projection optical system 3.

The projection optical system 3 is made up of a plurality of optical elements. Some of the optical elements are arranged so that their postures can be adjusted by the adjusting mechanism. A reticle stage 10 is so arranged as to be able to adjust the posture of the reticle 1.

Figure 2:
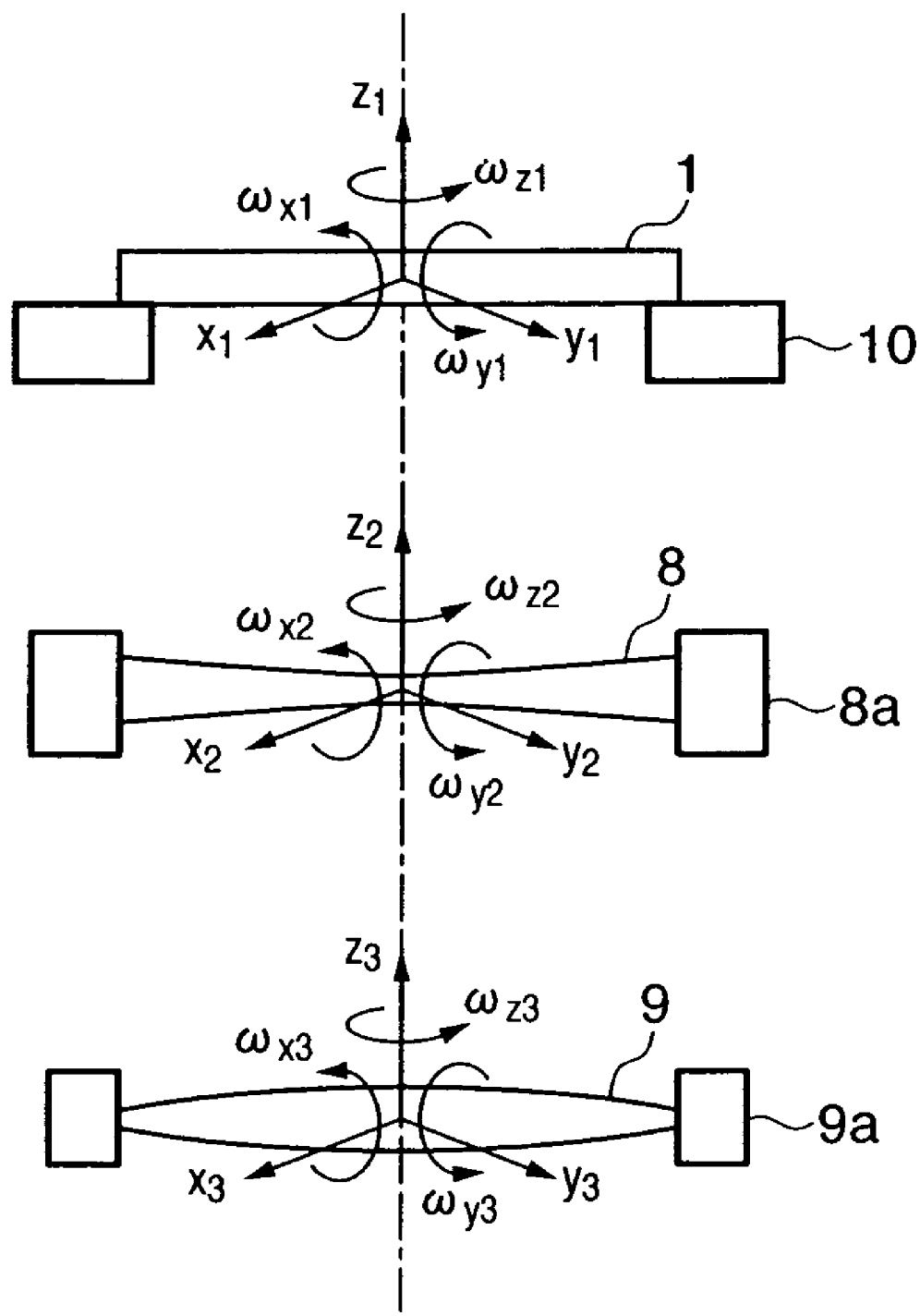
FIG. 2 is a view schematically showing the movable directions of a reticle and an optical element whose position are adjustable.

FIG. 2 is a view schematically showing the movable directions of the reticle 1 and optical elements 8 and 9 whose positions are adjustable. The optical elements 8 and 9 are components of the projection optical system 3. The position of the reticle 1 is adjusted by the reticle stage (reticle driving mechanism) 10 in a direction with six degrees of freedom under the control of the control unit 11. The positions of the optical elements 8 and 9 are respectively adjusted by driving mechanisms 8a and 9a in a direction with six degrees of freedom under the control of the control unit 11.

In adjustment of the projection optical system 3 under the control of the control unit 11, the wavefront aberration (optical characteristic) of the projection optical system 3 is measured by PMI (Phase Measurement Interferometer), or the like. The wavefront aberration is expanded by the Zernike function to obtain a Zernike coefficient for each image height. By this method, the following embodiments can attain a Zernike coefficient for each image height.

Two methods will be explained as a method of adjusting aberration, such as the wavefront aberration, of the projection optical system 3.

Figure 3:
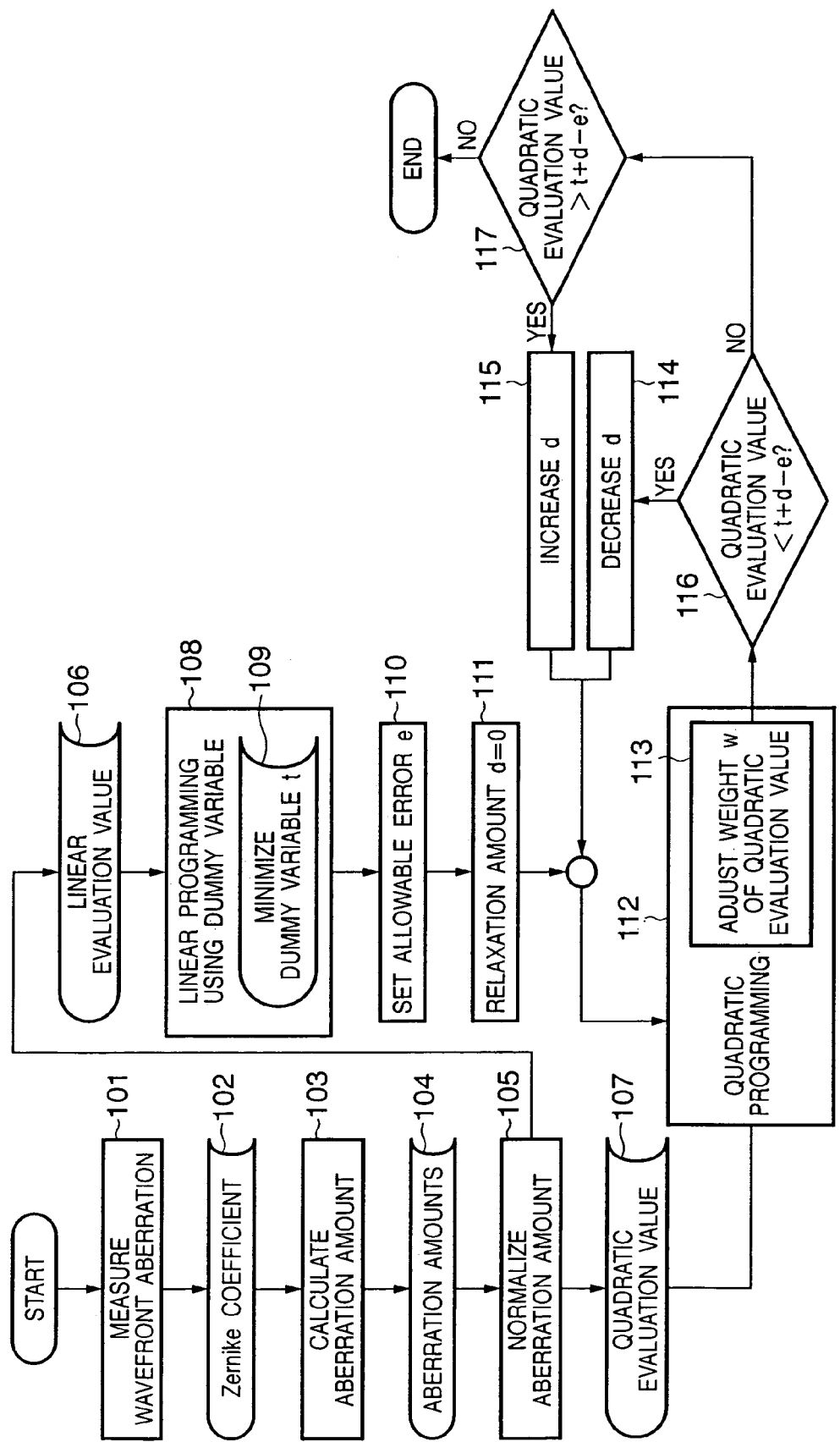
FIG. 3 is a flowchart for explaining automatic adjustment (configuration or procedures therefor) of a projection optical system according to the first embodiment.

FIG. 3 is a flowchart for explaining automatic adjustment of a projection optical system 3 according to the first embodiment. Automatic adjustment is controlled by a control unit 11. A block 101 executes a process of measuring the wavefront aberration of the projection optical system 3. A block 102 expands the wavefront aberration by J Zernike orthogonal functions for image heights at H points to obtain Zernike coefficients $Z_{jh}$.

Figure 5:
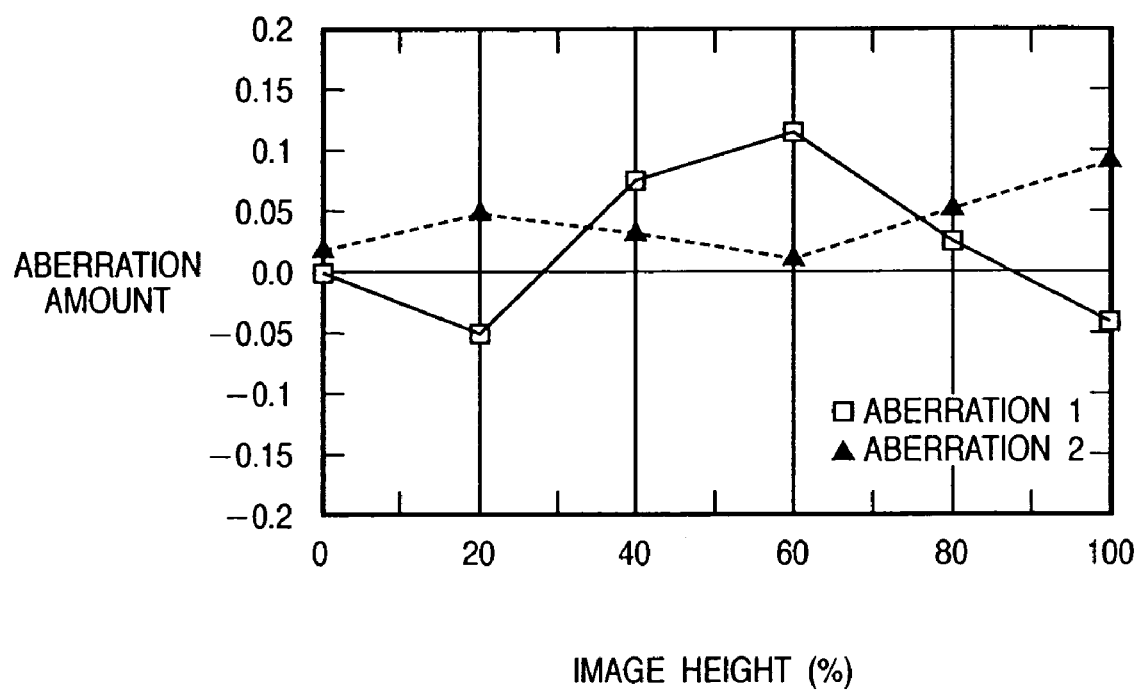
FIG. 5 is a graph providing an example in which each aberration is shown for each image height.

A block 103 calculates aberration amounts from the optical design values of the projection optical system 3, and obtains main aberration amounts of N types (e.g., coma, curvature of field, astigmatism, distortion, and telecentricity) for evaluating the projection optical system 3 for image heights at H points. A block 104 accumulates pieces of information obtained by the blocks 101 to 103. As shown in FIG. 5, the aberration amount can be given as a wavelength value.

A block 105 divides the aberration amounts by an allowance and normalizes them in order to optimize the aberrations of the projection optical system 3 with good balance in accordance with K adjustment amounts. The normalized aberration amount will be called an evaluation value.

Suffixes h, i, j, and k to be used below are defined by formulas (1) to (4)

$$h=1,\ldots,H \quad (1)$$

$$i=1,\ldots,N \quad (2)$$

$$j=1,\ldots,J \quad (3)$$

$$k=1,\ldots,K \quad (4)$$

A block 106 obtains, out of the evaluation values obtained by the block 105, an evaluation value (to be referred to as a linear evaluation value) which is expressed by the linear function of the Zernike coefficient. A block 107 obtains, out of the evaluation values obtained by the block 105, the square (to be referred to as a quadratic evaluation value) of RMS (Root Mean Square) of the wavefront aberration, which is expressed by the quadratic function.

According to this procedure, each aberration becomes permissible for an evaluation value of one or less and impermissible for an evaluation value of more than one. Thus, a plurality of aberrations can be minimized with good balance.

Figure 6:
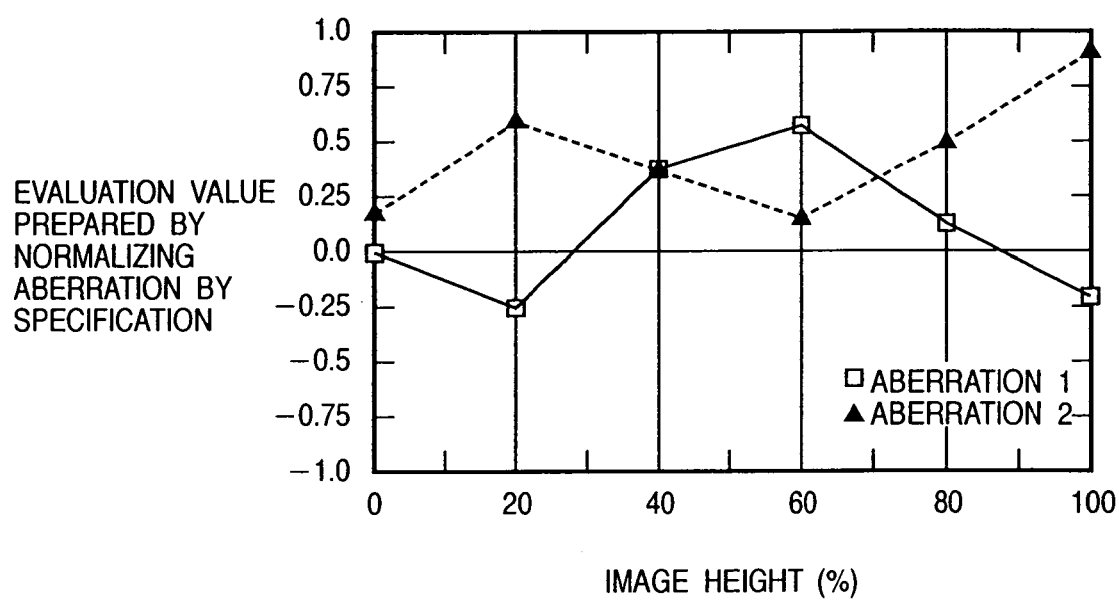
FIG. 6 is a graph providing an example in which an evaluation value obtained by normalizing each aberration is shown for each image height.

FIG. 6 is a graph showing the evaluation values of aberration (1) and aberration (2) shown in FIG. 5. As given by formula (5), a linear evaluation value $y_{ih}$ can be expressed by the linear sum of Zernike coefficients. When the adjustment amounts of respective components (e.g., optical elements 8 and 9 and a reticle stage 10) are changed, a Zernike coefficient $Z_{jh}$ for each image height can also be expressed by the linear sum of adjustment amounts $X_k$ of these components, as given by formula (6).

$$y_{ih} = \frac{1}{Y_i} \sum_{j=1}^{J} a_{ij} z_{jh} \tag{5}$$

$$z_{jh} = z_{0jh} + \sum_{k=1}^{J} b_{jhk} x_k \tag{6}$$

Formulas (5) and (6) derive formula (7):

$$y_{ih} = y_{0ih} + \sum_{k=1}^{J} c_{ihk} x_k \text{ for} \tag{7}$$

$$y_{0ih} = \frac{1}{Y_i} \sum_{j=1}^{J} a_{ij} z_{0jh} \tag{8}$$

$$c_{ihk} = \frac{1}{Y_i} \sum_{j=1}^{J} a_{ij} b_{jhk} \tag{9}$$

where $Y_i$: the allowance of the ith aberration;

$Y_{ih}$: the evaluation value of the ith aberration at an image height h;

at an image height h $Y_{0ih}$: the initial value of the evaluation value of the ith aberration at the image height h:

the iyh aberration at the image height h $Z_{jh}$: the jth Zernike coefficient at the image height h;

height h $Z_{0jh}$: the initial value of the jth Zernike coefficient at the image height h;

$x_k$: the kth adjustment amount;

$a_{ij}$: the degree of influence of the Zernike coefficient $z_{jh}$ on the ith aberration;

coefficient $Z_{jh}$ on the ith aberration $b_{jhk}$: the degree of influence of the adjustment amount $x_k$ of each part on the Zernike coefficient $z_{jh}$; and $c_{ihk}$: the degree of influence of the adjustment amount $x_k$ of each part on the evaluation value $y_{ih}$ of the image performance.

A block 108 minimizes only the linear evaluation value by applying to it linear programming, which has been proposed by Japanese Patent Laid-Open No. 2002-367886, and uses a dummy variable. A block 109 minimizes a dummy variable t serving as the upper limit value of the linear evaluation value.

More specifically, the block 109 uses linear programming given by formulas (10) to (13) to calculate the minimized dummy variable t, and the adjustment amounts $x_k$ of respective components (e.g., the optical elements 8 and 9 and the reticle stage 10) that are used to optimize aberrations with good balance.

Minimization: $f_i = t$ \hfill (10)

Constraint conditions:

$$y_{0ih} + \sum_{k=1}^{K} c_{ihk} x_k \leq t \tag{11}$$

$$-y_{0ih} - \sum_{k=1}^{K} c_{ihk} x_k \leq t \tag{12}$$

$$t \geq 0 \tag{13}$$

A quadratic evaluation value $rms^2$ is expressed by the sum of the squares of wavefront aberrations RMS with a weight $w_h$ for respective image heights, as given by formula (14):

$$rms^2 = \frac{1}{RMS^2} \sum_{h=1}^{H} w_h \sum_{j=1}^{J} \alpha_{jh} z_{jh}^2 \tag{14}$$

$$= \frac{1}{RMS^2} \sum_{h=1}^{H} w_h \sum_{j=1}^{J} \alpha_{jh} \left( z_{0jh} + \sum_{k=1}^{K} b_{jhk} x_k \right)^2$$

where $RMS^2$: the allowance of the square of the wavefront aberration RMS;

$rms^2$: the quadratic evaluation value of the wavefront aberration RMS; and $\alpha_{jh}$: the degree of influence of the Zernike coefficient $z_{jh}$ on $rms^2$ at the image height h.

The quadratic evaluation value is not always smaller than the dummy variable t, and thus aberrations including the quadratic evaluation value must be minimized separately.

A block 110 sets the value of an allowable error e in order to determine whether the linear evaluation value and quadratic evaluation value have been minimized with good balance. The allowable error e is the allowance of the difference between the linear evaluation value and the quadratic evaluation value.

A block 111 zeros the initial value of a relaxation amount d. A block 112 executes quadratic programming using the maximum value of the linear evaluation value as the sum of the dummy variable t and relaxation amount d. At this time, an objective function to be minimized is a quadratic evaluation value.

Quadratic programming having the constraint conditional expressions of formulas (16) to (18) is applied using the quadratic evaluation value given by formula (15) as an objective function and the sum t+d of the minimized dummy variable t and the relaxation amount d as a threshold. A block 113 compares quadratic evaluation values (wavefront aberrations RMS for image heights at a plurality of points) which are obtained by quadratic programming for the adjustment amounts $x_k$ of respective components, and adjusts the weight $w_h$ to balance the wavefront aberrations RMS of the image heights.

If the value of the minimized quadratic evaluation value is larger than t+d+e, the quadratic evaluation value is larger than the maximum value of the linear evaluation value. Thus, a block 117 causes a block 115 to increase the relaxation amount d and the block 112 to repeat execution of quadratic programming. To the contrary, if the value of the minimized quadratic evaluation value is smaller than t+d−e, the quadratic evaluation value is much smaller than the maximum value of the linear evaluation value. A block 116 causes a block 114 to decrease the relaxation amount d and the block 112 to repeat execution of quadratic programming.

At this time, the values $w_h$ and d are given proper positive real numbers on the basis of a search algorithm such as the hill-climbing method or genetic algorithm.

If the difference between the linear evaluation value and the quadratic evaluation value becomes smaller than e, calculation ends, and respective components (e.g., the optical elements 8 and 9 and the reticle stage 10) are adjusted in accordance with the obtained solution.

$$\text{Minimization: } f_2 = \frac{1}{\text{RMS}^2} \sum_{h=1}^{H} w_h \sum_{j=1}^{J} \alpha_{jh} \left( z_{0,jh} + \sum_{k=1}^{K} b_{jhk} x_k \right)^2 \quad (15)$$

Constraint conditions:

$$y_{0ih} + \sum_{k=1}^{n} c_{ihk} x_k \leq t + d \quad (16)$$

$$-y_{0ih} - \sum_{k=1}^{n} c_{ihk} x_k \leq t + d \quad (17)$$

$$x_k \geq 0 \quad (18)$$

where $w_h$: weight d: relaxation amount

When H=1, that is, only one wavefront aberration RMS is to be minimized, only the relaxation amount d is searched for, and this search is easy. To the contrary, it is highly likely that a search will take a long time for a large H.

After the solutions of the adjustment amounts $x_k$ of respective components (optical elements 8 and 9 and reticle stage 10) are obtained, these components are driven in accordance with the solutions to adjust the projection optical system 3.

Figure 4:
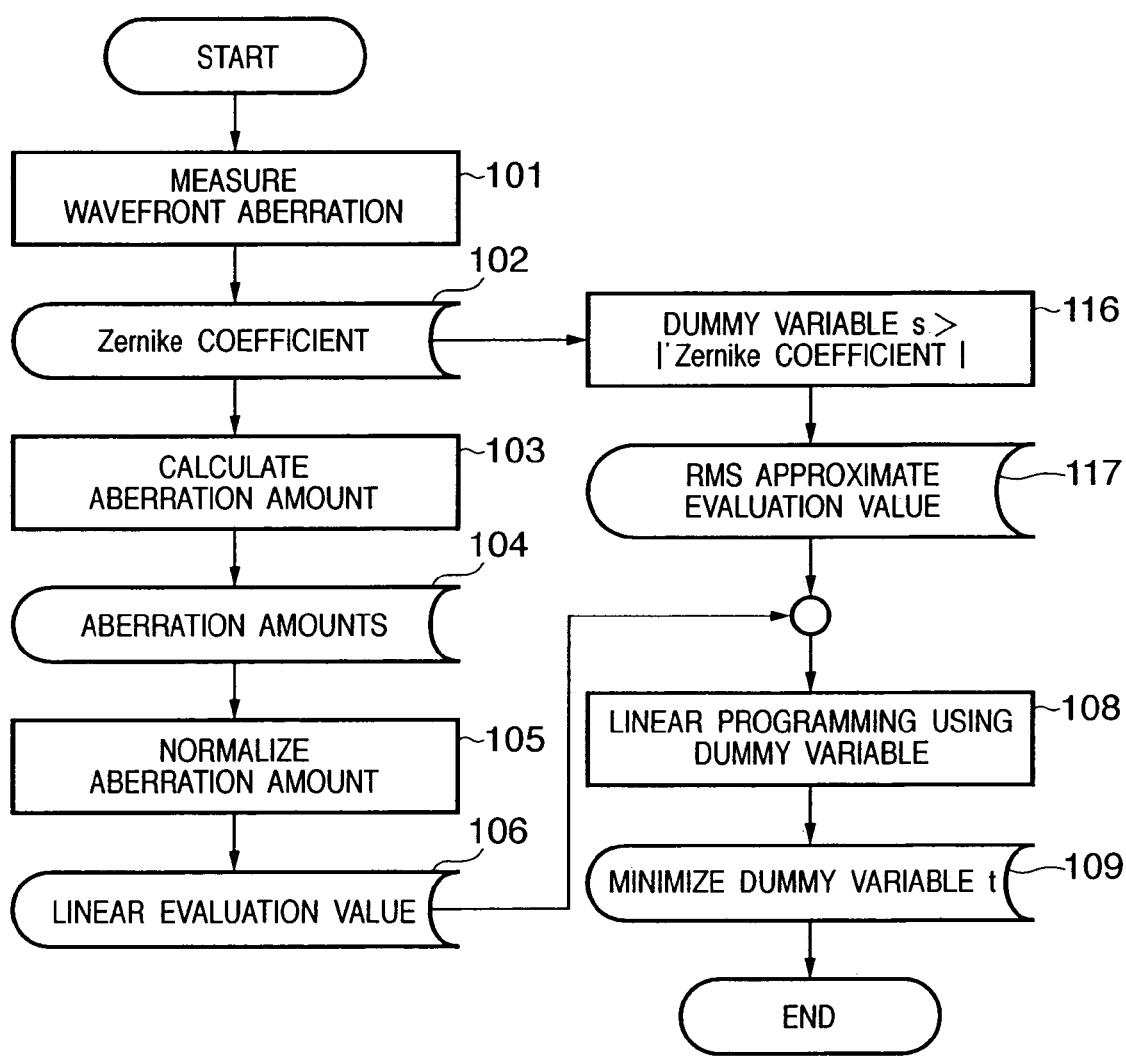
FIG. 4 is a flowchart for explaining automatic adjustment (configuration or procedures therefor) of a projection optical system according to the second embodiment.

FIG. 4 is a flowchart for explaining automatic adjustment of a projection optical system 3 according to the second embodiment. Automatic adjustment is controlled by a control unit 11. A block 101 executes a process of measuring the wavefront aberration of the projection optical system 3. A block 102 expands the wavefront aberration by J Zernike orthogonal functions for image heights at H points to obtain Zernike coefficients $z_{jh}$.

A block 103 calculates aberration amounts from the optical design values of the projection optical system 3, and obtains main aberration amounts of N types (e.g., coma, curvature of field, astigmatism, distortion, and telecentricity) for evaluating the projection optical system 3 for image heights at H points. A block 104 accumulates pieces of information obtained by the blocks 101 to 103.

A block 105 divides the aberration amounts by an allowance, normalizes them, and obtains normalized evaluation values (normalized aberration amounts) in order to optimize the aberrations of the projection optical system 3 with good balance in accordance with K adjustment amounts. A block 106 obtains a linear evaluation value from the evaluation values obtained by the block 105. The above configuration and procedures are the same as those in the first embodiment.

In the second embodiment, a block 116 defines the upper limit of the absolute value of the Zernike coefficient at the image height h by a dummy variable $s_{jh}$, as given by formula (19):

$$|z_{jh}| \leq s_{jh} \quad (19)$$

A block 117 expresses, by the linear function of the dummy variable $s_{jh}$, the upper limit of an approximate value calculated by dividing the wavefront aberration RMS by its allowance, as given by formula (20). The resultant value is defined as an RMS approximate evaluation value.

$$\frac{1}{\text{RMS}} \sqrt{\sum_{j=1}^{J} \alpha_{jh} z_{jh}^2} \approx \frac{1}{\text{RMS}} \sum_{j=1}^{J} \sqrt{\alpha_{jh}} |z_{jh}| \leq \frac{1}{\text{RMS}} \sum_{j=1}^{J} \sqrt{\alpha_{jh}} s_{jh} \quad (20)$$

$$\alpha_{jh} \geq 0, s_{jh} \geq 0$$

The RMS approximate evaluation value is the linear function of the dummy variable $s_{jh}$, and can be processed similarly to other linear evaluation values (their upper limit values are defined by the dummy variable t). Hence, all aberrations including the wavefront aberration RMS can be optimized with good balance by only linear programming which defines, by the dummy variable t, the upper limit values of all linear evaluation values including the linear function (linear evaluation value) of the dummy variable $s_{jh}$, as given by formulas (21) to (28).

A block 108 executes linear programming using the dummy variable t in accordance with formulas (21) to (28):

$$\text{Minimization: } f_1 = t \quad (21)$$

Constraint conditions:

$$x_k \geq 0 \quad (22)$$

$$s_{jh} \geq 0 \quad (23)$$

$$z_{jh} \leq s_{jh} \quad (24)$$

$$-z_{jh} \leq s_{jh} \quad (25)$$

$$y_{0ih} + \sum_{k=1}^{K} c_{ihk} x_k \leq t \quad (26)$$

$$-y_{0ih} - \sum_{k=1}^{K} c_{ihk} x_k \leq t \quad (27)$$

$$\frac{1}{\text{RMS}} \sum_{j=1}^{J} \sqrt{\alpha_{jh}} s_{jh} \leq t \quad (28)$$

After the solutions of the adjustment amounts $x_k$ of respective components (optical elements 8 and 9 and a reticle stage 10) are obtained, these components are driven in accordance with the solutions to adjust the projection optical system 3.

Linear programming using a dummy variable will be explained. Formula (29) shows the relationship between an error $e_i$ before adjustment, an error $e_i$ after adjustment, an adjustment sensitivity $a_{ij}$, and an adjustment amount $x_j$.

$$ei' = ei - \sum_{j=1}^{m} a_{ij}x_j, (i = 1, \ldots, n) \tag{29}$$

A linear programming problem is expressed by the objective function of formula (30) and the conditional expression of formula (31):

$$Z = \sum_{j=1}^{m} c_j x_j \tag{30}$$

$$\sum_{j=1}^{m} a_{ij}x_j \le c_i, (i = 1, \ldots, n) \tag{31}$$

Of these formulas, the objective function is defined by the linear expression of a controlled variable, and is to be minimized or maximized. The conditional expression is an equality or inequality expressed by the linear function of a controlled variable. The solvers of some linear programming problems may process only nonnegative controlled variables. However, nonnegative conditions do not inhibit application of linear programming because variable replacement given by formula (32) makes it possible to express an actual controlled variable $x_j$ which does not satisfy a nonnegative condition by two variables $x_j'$ and $x_j''$ which satisfy the nonnegative condition.

$$x_j = x_j' - x_j'' \tag{32}$$

In practice, it may be required that a controlled variable falls within a predetermined range. This condition can be expressed by the conditional expression formula (31).

Linear programming using a dummy variable minimizes the maximum absolute value of $e_i'$, (i=1, ..., n). For this purpose, the dummy variable t which satisfies $|e_i'| \le t$, (i=1, ..., n) is introduced, and a linear programming problem which minimizes t is formulated. That is, an objective function which minimizes the controlled variable t is set, as given by formula (33). A linear programming problem which sets the conditional expressions of formulas (34) and (35) is so defined as to adjust the dummy variable t to the limit value of an error and that of a value prepared by inverting the sign of the error. By solving this problem, the maximum absolute value of a residual after adjustment can be minimized.

$$z = t \tag{33}$$

$$e_i - \sum_{j=1}^{m} a_{ij}x_j \le t, (i = 1, \ldots, n) \tag{34}$$

$$-e_i + \sum_{j=1}^{m} a_{ij}x_j \le t, (i = 1, \ldots, n) \tag{35}$$

Minimization of the maximum absolute value by linear programming using a dummy variable includes the first to fifth steps. In the first step, the dummy variable t which makes it a condition that the dummy variable t is equal to or larger than an evaluation term (absolute value of an error after adjustment at each point: $|e_i'|$) is defined by an inequality. In the second step, the range of a controlled variable is expressed by an inequality (see formulas (30) and (31)). In the third step, the variable is so converted as to satisfy a nonnegative condition (see formula (32)). In the fourth step, a linear programming model is formulated. In the fifth step, the optimum solution of the controlled variable is calculated on the basis of linear programming (see formulas (33) to (35)).

Since a formulated problem always has a solution, the above calculation method can provide the controlled variable $x_j$, which strictly minimizes the maximum absolute value of an error. In an exposure apparatus according to the embodiments, the number of controlled variables is not large, and even a general linear programming problem solver can finish the calculation in a short time. This method is, therefore, effective for real-time adjustment because a high throughput can be stably maintained.

Figure 7:
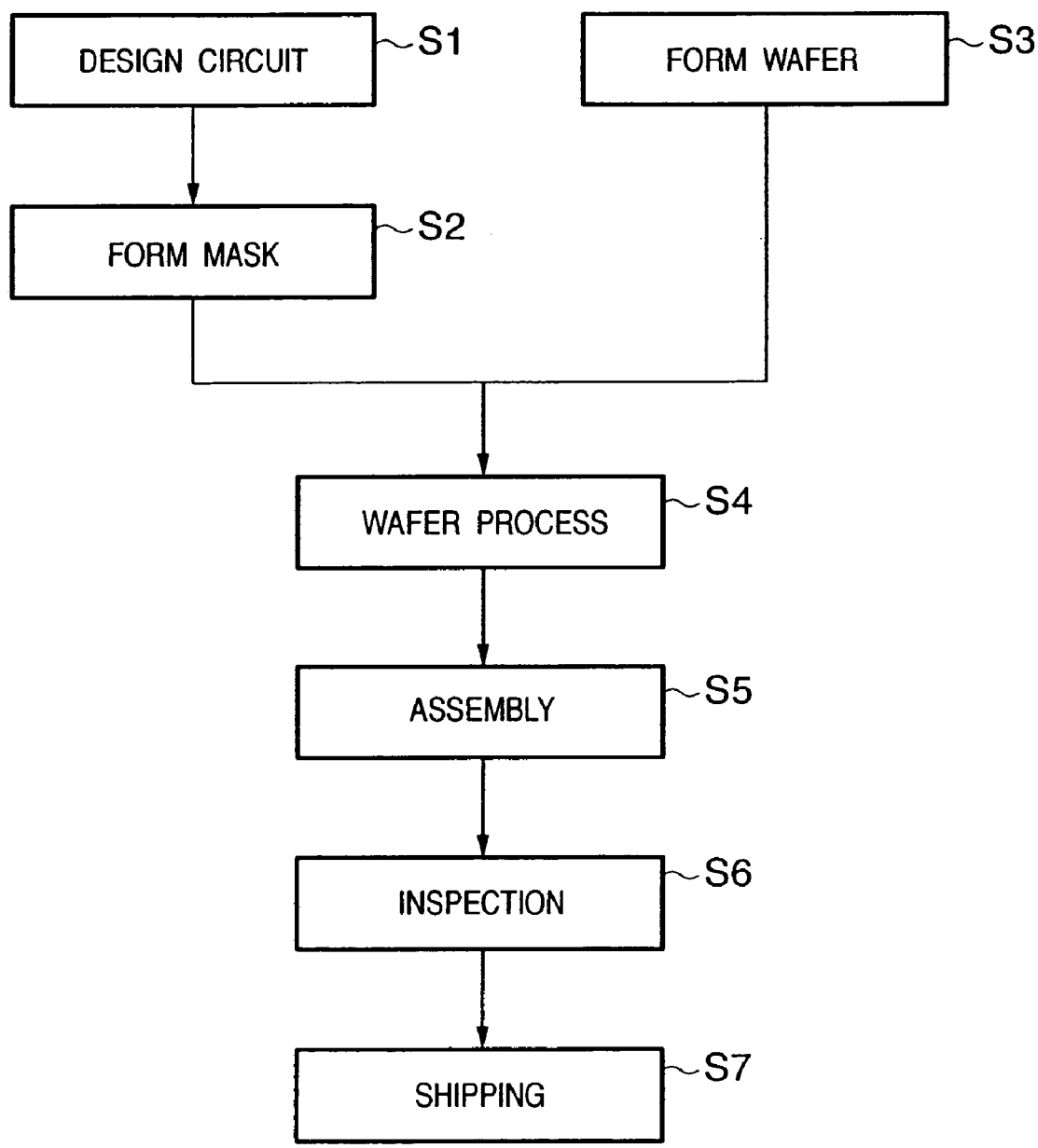
FIG. 7 is a flowchart showing the flow of the whole manufacturing process of a semiconductor device.

A semiconductor device manufacturing process using the above exposure apparatus will be explained. FIG. 7 is a flowchart showing the flow of the whole manufacturing process of a semiconductor device. In step 1 (circuit design), the circuit of a semiconductor device is designed. In step 2 (mask formation), a mask is formed on the basis of the designed circuit pattern. In step 3 (wafer formation), a wafer is formed using a material such as silicon. In step 4 (wafer process), called a pre-process, an actual circuit is formed on the wafer by lithography using the mask and wafer. Step 5 (assembly), called a post-process, is the step of forming a semiconductor chip by using the wafer formed in step 4, and includes an assembly process (dicing and bonding) and a packaging process (chip encapsulation). In step 6 (inspection), the semiconductor device manufactured in step 5 undergoes inspections, such as an operation confirmation test and a durability test. After these steps, the semiconductor device is completed and shipped (step 7).

Figure 8:
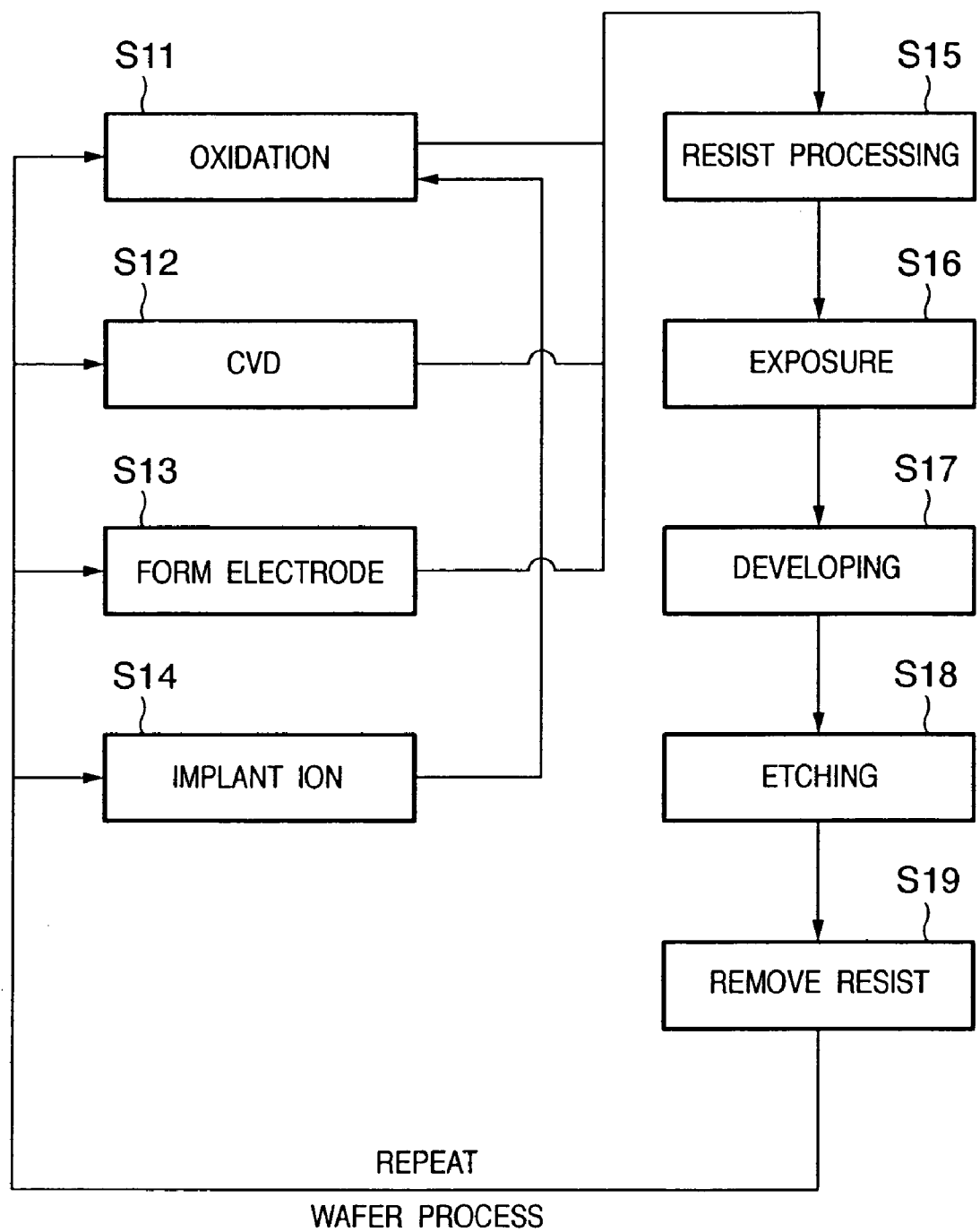
FIG. 8 is a flowchart showing the detailed flow of a wafer process.

FIG. 8 is a flowchart showing the detailed flow of the wafer process. In step 11 (oxidation), the wafer surface is oxidized. In step 12 (CVD), an insulating film is formed on the wafer surface. In step 13 (electrode formation), an electrode is formed on the wafer by vapor deposition. In step 14 (ion implantation), ions are implanted in the wafer. In step 15 (resist processing), a photosensitive agent is applied to the wafer. In step 16 (exposure), a circuit pattern is transferred onto the photosensitive agent on the wafer by the above-mentioned exposure apparatus. In step 17 (developing), the exposed wafer is developed. In step 18 (etching), the resist is etched except for the developed resist image. In step 19 (resist removal), an unnecessary resist after etching is removed. These steps are repeated to form multiple circuit patterns on the wafer.

As many apparently widely different embodiments of the present invention can be made without departing from the spirit and scope thereof, it is to be understood that the invention is not limited to the specific embodiments thereof except as defined in the claims.

CLAIM OF PRIORITY

This application claims priority from Japanese Patent application No. 2004-077044 filed on Mar. 17, 2004, the entire contents of which are hereby incorporated by reference herein.

What is claimed is:

1. An optical apparatus which includes an image forming optical system having a movable optical element, and a driving mechanism configured to move said optical element, said apparatus comprising:
a first block which obtains a linear evaluation value by normalizing, by a first tolerance, an aberration expressed by a linear function of a position of said movable optical element out of aberrations of said optical system, and a quadratic evaluation value by normalizing, by a second tolerance, a square of a root mean square of wavefront aberration of said optical system expressed by a quadratic function of the position out of the aberrations of said optical system;
a second block which uses a dummy variable t as an upper limit value of the linear evaluation value and obtains a minimum value of the dummy variable t by a linear programming, wherein the linear programming is given by the following formulas, Minimization $f_1 = t$ Constraint conditions:

$$y_{0ih} + \sum_{k=1}^{K} c_{ihk} x_k \leq t$$

$$-y_{0ih} - \sum_{k=1}^{K} c_{ihk} x_k \leq t$$

$$t \geq 0$$

where
$y_{0ih}$: the initial value of the evaluation value of the i-th aberration at the image height h;
$x_k$: the k-th adjustment amount;
$c_{ihk}$: the degree of influence of the adjustment amount $x_k$ of each part on the evaluation value $y_{ih}$ of the image performance; and
a third block which determines a position of said optical element to be moved by said driving mechanism, by a quadratic programming, so as to minimize the quadratic evaluation value under a constraint condition that the upper limit value of the linear evaluation value is a value prepared by adding a relaxation amount d to the minimum value of the dummy variable t that is obtained by said second block,
wherein said third block minimizes the quadratic evaluation value by adjusting the quadratic evaluation values and the relaxation amount based on the prepared value and the quadratic evaluation value having been obtained using the prepared value, wherein the quadratic programming is given by the following formulas, Minimization:

$$f_2 = \frac{1}{\text{RMS}^2} \sum_{h=1}^{H} w_h \sum_{j=1}^{J} \alpha_{jh} \left( z_{0jh} + \sum_{k=1}^{K} b_{jhk} x_k \right)^2$$

Constraint conditions:

$$y_{0ih} + \sum_{k=1}^{n} c_{ihk} x_k \leq t + d$$

$$-y_{0ih} - \sum_{k=1}^{n} c_{ihk} x_k \leq t + d$$

$$x_k \geq 0,$$

where
$w_h$: weight,
wherein said driving mechanism is configured to move said optical element in accordance with the determined position.

2. An apparatus according to claim 1, wherein said apparatus is an exposure apparatus which transfers a pattern to a substrate using said optical system.

3. A method of manufacturing a device, said method comprising steps of:
transferring a pattern to a substrate using an exposure apparatus as defined in claim 2;
developing the substrate to which the pattern has been transferred; and
processing the developed substrate to manufacture the device.

4. An optical apparatus including an optical system having a movable optical element, and a driving mechanism configured to move said optical element, said apparatus comprising:
a first block which obtains a linear evaluation value by normalizing, by a tolerance, an aberration expressed by a linear function of a position of said movable optical element out of aberrations of said optical system;
a second block which uses a first dummy variable as an upper limit of an absolute value of a Zernike coefficient of a wavefront aberration of said optical system, and obtains a linear evaluation value that approximates root mean square of the wavefront aberration by a linear function of the first dummy variable, wherein the Zernike coefficient is given by the following formula, $$z_{jh} = z_{0jh} + \sum_{k=1}^{J} b_{jhk} x_k,$$

where
$z_{0jh}$: the initial value of the j-th Zernike coefficient at the image height h,
$b_{jhk}$: the degree of influence of the adjustment amount $x_k$ of each part on the Zernkie coefficient $z_{jh}$,
$x_k$: the k-th adjustment amount; and
a third block which uses a second dummy variable t as an upper limit of the linear evaluation values obtained by said first block and said second block, and determines a position of said optical element to be moved by said driving mechanism by a linear programming so as to minimize the second dummy variable, wherein the linear programming is given by the following formulas, Minimization: $f_1 = t$ Constraint conditions:

$$x_k \geq 0$$

$$s_{jh} \geq 0$$

$$z_{jh} \leq s_{jh}$$

-continued $$-z_{jh} \leq s_{jh}$$

$$y_{0ih} + \sum_{k=1}^{K} c_{ihk} x_k \leq t$$

$$-y_{0ih} - \sum_{k=1}^{K} c_{ihk} x_k \leq t$$

$$\frac{1}{\text{RMS}} \sum_{j=1}^{J} \sqrt{\alpha_{jh} s_{jh}} \leq t$$

$$\alpha_{jh} \geq 0$$

$$s_{jh} \geq 0$$

where $c_{ihk}$: the degree of influence of the adjustment;

$y_{0hk}$: the initial value of the evaluation value of the ith aberration at the image height h, wherein said driving mechanism is configured to move said optical element in accordance with the determined position.

5. An apparatus according to claim 4, wherein said apparatus is an exposure apparatus which transfers a pattern to a substrate using said optical system.

6. A method of manufacturing a device, said method comprising steps of:
   transferring a pattern to a substrate using an exposure apparatus as defined in claim 5;
   developing the substrate to which the pattern has been transferred; and
   processing the developed substrate to manufacture the device.

7. A method of determining a position of an optical element in an optical apparatus which includes an image forming optical system having the optical element, and a driving mechanism configured to move the optical element, said method comprising:
   a first step of obtaining a linear evaluation value by normalizing, by a first tolerance, an aberration expressed by a linear function of a position of the optical element out of aberrations of the optical system, and a quadratic evaluation value by normalizing, by a second tolerance, a square of a root mean square of wavefront aberration of the optical system expressed by a quadratic function of the position out of the aberrations of the optical system;
   a second step of using a dummy variable t as an upper limit value of the linear evaluation value, obtaining a minimum value of the dummy variable t by a linear programming, wherein the linear programming is by the following formulas, Minimization: $f_1 = t$ Constraint conditions:

$$y_{0ih} + \sum_{k=1}^{K} c_{ihk} x_k \leq t$$

$$-y_{0ih} + \sum_{k=1}^{K} c_{ihk} x_k \leq t$$

$$t \geq 0$$

where $y_{0ih}$: the initial value of the evaluation value of the i-th aberration at the image height h;

$x_k$: the k-th adjustment amount;

$c_{ihk}$: the degree of influence of the adjustment amount $x_k$ of each part on the evaluation value $y_{ih}$ of the image performance; and a third step of determining a position of the optical element to be moved by the driving mechanism, by a quadratic programming, so as to minimize the quadratic evaluation value under a constraint condition that the upper limit value of the linear evaluation value is a value prepared by adding a relaxation amount d to the minimum value of the dummy variable t that is obtained in the second step, wherein in the third step, the quadratic evaluation value is minimized by adjusting t the quadratic evaluation values and the relaxation amount based on the prepared value and the quadratic evaluation value having been obtained using the prepared value, and the driving mechanism is configured to move said optical element in accordance with the determined position, and the quadratic programming is given by the following formulas, Minimization:

$$f_2 = \frac{1}{\text{RMS}^2} \sum_{h=1}^{H} w_h \sum_{j=1}^{J} \alpha_{jh} \left( z_{0,jh} + \sum_{k=1}^{K} b_{jhk} x_k \right)^2$$

Constraint conditions:

$$y_{0ih} + \sum_{k=1}^{n} c_{ihk} x_k \leq t + d$$

$$-y_{0ih} - \sum_{k=1}^{n} c_{ihk} x_k \leq t + d$$

$$x_k \geq 0,$$

where $w_h$: weight, and wherein the driving mechanism is configured to move the optical element in accordance with the determined position.

8. A method according to claim 7, wherein the apparatus is an exposure apparatus which transfers a pattern to a substrate using the optical system.

9. A method of manufacturing a device, said method comprising steps of:
   moving an optical element in an optical system of an exposure apparatus to a position as determined in accordance with a method as defined in claim 8;
   transferring a pattern to a substrate using the exposure apparatus of which the optical element is moved in said moving step;
   developing the substrate to which the pattern has been transferred; and
   processing the developed substrate to manufacture the device.

10. A method of determining a position of an optical element in an optical apparatus which includes an optical system having the optical element, and a driving mechanism configured to move the optical element, said method comprising:

a first step of obtaining a linear evaluation value by normalizing, by a tolerance, and aberration expressed by a linear function of a position of the optical element out of aberrations of the optical system;

a second step of, using a first dummy variable as an upper limit of an absolute value of a Zernike coefficient of a wavefront aberration of the optical system, and obtaining a linear evaluation value which approximates root mean square of the wavefront aberration by a linear function of the first dummy variable, wherein the Zernike coefficient is given by the following formula, $$z_{jh} = z_{0jh} + \sum_{k=1}^{J} b_{jhk} x_k,$$

where $z_{0jh}$: the initial value of the j-th Zernike coefficient at the image height h, $b_{jhk}$: the degree of influence of the adjustment amount $x_k$ of each part on the Zernike coefficient $z_{jh}$, $x_k$: the k-th adjustment amount; and a third step of, using a second dummy variable t as an upper limit of the linear evaluation values obtained in the first step and the second step, and determining a position of the optical element to be moved by the driving mechanism by a linear programming so as to minimize the second dummy variable, wherein the linear programming is given by the following formulas, Minimization: $f_1 = t$ Constraint conditions:

$x_k \geq 0$ $s_{jh} \geq 0$ $z_{jh} \leq s_{jh}$ $-z_{jh} \leq s_{jh}$ $y_{0ih} + \sum_{k=1}^{K} c_{ihk} x_k \leq t$ $-y_{0ih} - \sum_{k=1}^{K} c_{ihk} x_k \leq t$ -continued $$\frac{1}{\text{RMS}} \sum_{j=1}^{J} \sqrt{\alpha_{jh} s_{jh}} \leq t$$

$\alpha_{jh} \geq 0$ $s_{jh} \geq 0$ $-y_{0ih} - \sum_{k=1}^{K} c_{ihk} x_k \leq t$ $$\frac{1}{\text{RMS}} \sum_{j=1}^{J} \sqrt{\alpha_{jh} s_{jh}} \leq t$$

$\alpha_{jh} \geq 0$ $s_{jh} \geq 0$ where $c_{ihk}$: the dgree of influence of the adjustment, $y_{0ih}$: the initial value of the evaluation value of the ith aberration at the image height h, wherein the driving mechanism is configured to move the optical element in accordance with the determined position.

11. A method according to claim 10, wherein the apparatus is an exposure apparatus which transfers a pattern to a substrate using the optical system.

12. A method of manufacturing a device, said method comprising steps of:

moving an optical element in an optical system of an exposure apparatus to a position as determined in accordance with a method as defined in claim 11;

transferring a pattern to a substrate using the exposure apparatus of which the optical element is moved in said moving step;

developing the substrate to which the pattern has been transferred; and processing the developed substrate to manufacture the device.

* * * * *

UNITED STATES PATENT AND TRADEMARK OFFICE
CERTIFICATE OF CORRECTION

PATENT NO. : 7,230,692 B2
APPLICATION NO. : 11/080407
DATED : June 12, 2007
INVENTOR(S) : Youzou Fukagawa et al.

It is certified that error appears in the above-identified patent and that said Letters Patent is hereby corrected as shown below:

COLUMN 1:
    Line 29, "aberration" should read -- aberration, --.

COLUMN 3:
    Line 35, "position" should read -- positions --.

COLUMN 5:
    Line 45 should be deleted.
    Line 47, "height h:" should read -- height h; --.
    Line 49 should be deleted.
    Line 52 should be deleted.
    Line 58 should be deleted.

COLUMN 6:
    Line 10, "Minimization: f$i$=t" should read -- Minimization: $f_1$=t --.

COLUMN 9:
    Line 6, "error $e_i$" should read -- $e_i'$ --.
    Line 41, "falls" should read -- fall --.

COLUMN 12:
    Line 48, "Zernkie" should read -- Zernike --.

COLUMN 13:
    Line 19, "$y_{0hk}$:" should read -- $y_{0ih}$: --.
    Line 53, "is" should read -- is given --.

UNITED STATES PATENT AND TRADEMARK OFFICE
CERTIFICATE OF CORRECTION

PATENT NO. : 7,230,692 B2
APPLICATION NO. : 11/080407
DATED : June 12, 2007
INVENTOR(S) : Youzou Fukagawa et al.

It is certified that error appears in the above-identified patent and that said Letters Patent is hereby corrected as shown below:

COLUMN 14:
Line 17, "t" should be deleted.

COLUMN 16:
Lines 11-19 should be deleted.
Line 24, "dgree" should read -- degree --.

Signed and Sealed this

Third Day of June, 2008

JON W. DUDAS
*Director of the United States Patent and Trademark Office*